(12) United States Patent
Yamagishi et al.

(10) Patent No.: US 6,300,556 B1
(45) Date of Patent: Oct. 9, 2001

(54) SOLAR CELL MODULE

(75) Inventors: Hideo Yamagishi, Kyoto; Toshihide Ohkatsu, Osaka; Masataka Kondo, Kobe, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/392,083

(22) Filed: Sep. 8, 1999

(30) Foreign Application Priority Data

| Nov. 12, 1998 | (JP) | 10-322201 |
| Mar. 10, 1999 | (JP) | 11-062657 |
| Mar. 23, 1999 | (JP) | 11-077978 |
| Jun. 4, 1999 | (JP) | 11-157465 |

(51) Int. Cl.[7] ............................................. H01L 31/00
(52) U.S. Cl. ................................... 136/251; 136/259
(58) Field of Search ..................................... 136/251, 259

(56) References Cited

U.S. PATENT DOCUMENTS

| 4,578,526 | 3/1986 | Nakano et al. ...................... 136/251 |
| 5,022,930 | 6/1991 | Ackerman et al. .................. 136/251 |
| 5,578,502 | 11/1996 | Albright et al. ........................ 437/4 |
| 5,580,509 | 12/1996 | Van Den Berg et al. ...... 264/272.15 |

FOREIGN PATENT DOCUMENTS

| 196 11 410 | 8/1997 | (DE) . |
| 0406814 | 1/1991 | (EP) . |
| 0 577 985 | 1/1994 | (EP) . |
| 0631328 | 12/1994 | (EP) . |
| 59-61971 | 4/1984 | (JP) . |
| 59155973 | 9/1984 | (JP) . |
| 60-32352 | 2/1985 | (JP) . |
| 60030163 | 2/1985 | (JP) . |
| 61101083 | 5/1986 | (JP) . |
| 61272975 | 12/1986 | (JP) . |
| 8-83919 | 3/1996 | (JP) . |
| 08125208 | 5/1996 | (JP) . |
| 09-260704 | 10/1997 | (JP) . |
| 10 092775 | 4/1998 | (JP) . |

*Primary Examiner*—Mark Chapman
(74) *Attorney, Agent, or Firm*—Hogan & Hartson, L.L.P.

(57) ABSTRACT

A thin film solar cell module which comprises a first electrode layer, a semiconductor layer and a second electrode layer, which are deposited on a substrate and at least part of which is worked to partition these layers into a plurality of cells which are electrically connected with each other and sealed with an encapsulant. At least part of at least one of the first electrode layer, the semiconductor layer and the second electrode layer, which is located at the periphery of the substrate, is removed by mechanical means or by means of laser beam. The periphery of the connected solar cells may be surrounded by a high adhesive strength region.

11 Claims, 2 Drawing Sheets

SOLAR CELL MODULE

BACKGROUND OF THE INVENTION

This invention relates to a solar cell module, and in particular to a thin film solar cell module which is useful for a power generation from sunlight.

There is known the following method as one of the methods for manufacturing a thin film solar cell module. Namely, a transparent electrode layer, a photoelectric semiconductor layer and a metal layer, which have been deposited on a light-transmitting glass substrate, are at least partially worked by means of an optical beam thereby to partition these layers into a plurality of cells to isolate one cell from another cell, which are then electrically connected with each other, and after terminals are attached to these cells, the reverse surface (the surface opposite to the light-transmitting glass substrate) is sealed with an encapsulant such as a resin for protecting the power-generating portions thereof, the resultant body being finally fixed to a mounting frame.

The dielectric strength is one of the characteristics demanded for a solar cell module manufactured in this manner. The dielectric strength of solar cell module can be determined generally by measuring the withstand voltage between a terminal of solar cell and the frame.

The thin film solar cell is generally constituted by a lamination of thin films such as a transparent electrode layer, a photoelectric semiconductor layer and a metal layer, and most of these layers are generally formed through a vapor phase reaction. Accordingly, it is generally difficult, in the process of forming such a laminate through this vapor phase reaction, to restrict film forming area to so-called active portion of the solar cell. Occasionally, any of these layers may extend also to the other surface of the substrate. If such a substrate is attached as it is to the frame, it is more likely that the electric potential of the frame may become identical with that of the active portion of the solar cell. Because of this, the conventional thin film solar cells are generally poor in dielectric strength.

With a view to overcome this problem, there has been proposed a method wherein the active region occupying the central portion of solar cell is electrically isolated from the peripheral region of solar cell, which has much possibilities of being electrically contacted with the frame, by making use of a laser beam which is employed in the patterning of the layers at the occasion of electrical connection of cells. However, the solar cell module manufactured by making use of this method is accompanied with a problem that even though the solar cell exhibits an excellent dielectric strength immediately after the manufacture thereof, this property of dielectric strength is sharply deteriorated when the solar cell module is left in an environment of high temperature and high humidity. Accordingly, this method has been found poor not only in manufacturing yield due to a low reliability but also in productivity, thus making this method useless in industrial viewpoint.

The thin film solar cell module of this kind is especially accompanied with a problem that when it is employed out of door, water may be penetrated into the active portion (power generating region) of the solar cell, thus denaturing or corroding this active portion, resulting in a deterioration of the power-generating property thereof. One of the causes of this problem is the penetration of water through an interface between the substrate and the encapsulant at the peripheral portion of the solar cell module. Therefore, it is highly desired to prevent the penetration of water through a peripheral portion of the solar cell module and to improve the weather resistance of the solar cell module.

BRIEF SUMMARY OF THE INVENTION

Therefore, the object of the present invention is to provide a solar cell module, which makes it possible, while assuring a high productivity, to ensure the insulation between the power-generating active portion thereof and the peripheral region thereof, or the insulation between the solar cell module and the frame thereof.

Another object of the present invention is to provide a solar cell module, which is excellent in dielectric strength, free from deterioration of property due to a corrosion after sealing thereof and capable of maintaining a sufficient strength of glass substrate, and which can be manufactured in a stable manufacturing process and in high productivity.

Still another object of the present invention is to provide a solar cell module, which is capable of preventing the penetration of water once it is sealed with an encapsulant thereby making it possible to prevent the power-generating property thereof from being deteriorated due to a corrosion by water, and which can be manufactured with high productivity.

According to this invention, there is provided a thin film solar cell module which comprises a first electrode layer, a semiconductor layer and a second electrode layer, which are deposited on a substrate and at least part of which is worked to partition these layers into a plurality of cells which are electrically connected with each other and sealed with an encapsulant; wherein at least part of at least one of the first electrode layer, the semiconductor layer and the second electrode layer, which is located at the periphery of the substrate, is removed by mechanical means or by means of laser beam.

According to this invention, there is also provided a solar cell module which comprises a laminate layer comprising a first electrode layer, a semiconductor layer and a second electrode layer, which are deposited on a substrate and patterned thereby to partition these layers into a plurality of solar cells which are electrically connected with each other and sealed with an encapsulant; wherein a periphery of the electrically connected solar cells is surrounded by a high adhesive strength region, and adhesive strength between the high adhesive strength region and the encapsulant is larger than the adhesive strength between the encapsulant and the electrically connected solar cells.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
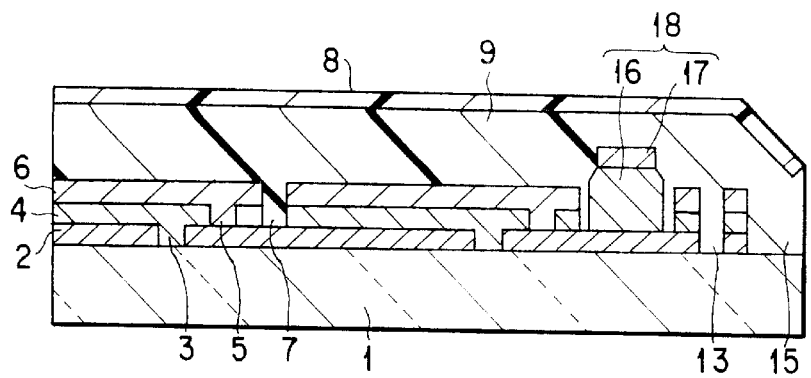
FIG. 1 is a cross-sectional view of a thin film solar cell module according to Examples 1 and 2.

The solar cell module according to this invention will be explained in detail below.

An example of the thin film solar cell module is constructed such that a first electrode layer (a transparent electrode layer), a semiconductor layer and a second electrode layer (a reverse electrode layer) are deposited on a substrate, and at least part of these layers is worked by means of a laser beam thereby to partition these layers into a plurality of cells which are then electrically connected with each other.

As for the substrate, a transparent substrate such as a glass substrate can be employed. As for the first electrode layer, a transparent conductive oxide such as $SnO_2$, ZnO, ITO, etc. can be employed. As for the semiconductor layer, a layer mainly consisting of silicon, i.e. a laminate structure, such as a p-type a-Si:H layer, i-type a-Si:H layer, and an n-type micro-crystalline Si:H layer can be employed. It is also possible to employ a laminate structure of polycrystalline silicon layer which is capable of forming a pin junction may be also employed. As for the second electrode layer (a reverse electrode layer), Ag, Al, Cr, Ti, or a laminate consisting of any one of these metals and a metal oxide can be employed.

Each of these layers is deposited by means of a CVD method or a sputtering method, and then partitioned into individual solar cells with a predetermined interval disposed therebetween by means of laser scribing. Then, the neighboring solar cells are electrically connected in series (or in parallel), thus forming a thin film solar cell module.

The thin film solar cell module according to a first embodiment of this invention is featured in that at least part of at least one of the first electrode layer, the semiconductor layer and the second electrode layer, which is located at the periphery of the substrate, is removed by mechanical means or by means of laser beam.

The removal of at least part of at least one of the first electrode layer, the semiconductor layer and the second electrode layer by mechanical means in the thin film solar cell module of this invention can be performed by means of a surface abrasion method or a mechanical etching method employing a blasting of fine particles. The fine particles to be employed in the latter method may preferably be 100 μm or less in particle diameter.

It is also possible, other than the aforementioned mechanical etching method, to perform the removal of at least part of at least one of the first electrode layer, the semiconductor layer and the second electrode layer, which is located at the periphery of the substrate, by means of laser beam. When a laser beam is employed, the removal of the semiconductor layer and the second electrode layer can be easily performed without removing the light-transmitting first electrode layer, thus exposing the first electrode layer. As for the laser beam, a beam which is enlarged in beam diameter can be employed. Preferable range of beam diameter to be employed in this case is 100 to 500 μm.

The width to be removed at the periphery of the light-transmitting substrate may be determined depending on the dielectric strength and on the effective surface factor, specific dimensions thereof being 0.5 mm or more, preferably 0.5 mm to 10 mm, more preferably 1 mm to 5 mm.

It is important to note that it has been found by the present inventors that since the surface of the thin film solar cell module is not smooth, the first electrode layer (a transparent electrode layer) which is desired to be removed can be completely removed only under a very limited condition as a matter of fact. Therefore, when the entire thickness of the first electrode layer is forcibly removed, the underlying light-transmitting substrate may be damaged, thus greatly deteriorating the mechanical strength of the substrate.

It has been found by the present inventors that it is possible, by performing the sealing using EVA (ethylene-vinyl acetate copolymer) and a back film while allowing the transparent electrode layer left remained, to prominently improve the adhesive strength of the interface between the EVA and the substrate (a transparent electrode layer), thus making it possible to substantially prevent water from penetrating through a peripheral portion of the substrate.

Accordingly, in the case of the thin film solar cell module according to the first embodiment of this invention, it is no more required to remove the entire thickness of a portion of the first electrode layer, the semiconductor layer and the second electrode layer, which is located at the periphery of the substrate. Namely, it has been confirmed that, even if the sealing is performed while allowing the transparent electrode layer left exposed, it is possible to ensure a high adhesive strength thereof with the resin, thus making it possible to prevent water from penetrating through a peripheral portion of the substrate.

If the entire layers of the first electrode layer, the semiconductor layer and the second electrode layer is to be removed, the removal by mechanical means may be effected also against the surface of the light-transmitting substrate. In this case, a total removal thickness of the substrate, the first electrode layer, the semiconductor layer and the second electrode layer, which are removed by the mechanical means, should be controlled within the range of 5 μm to 100 μm, more preferably within the range of 10 μm to 25 μm.

It is preferable in the thin film solar cell module according to the first embodiment of this invention to employ a light-transmitting glass substrate whose peripheral edge is free from a right-angled portion or an acute-angled portion in order to prevent the substrate from being cracked during the use thereof. By employing such a substrate, a module which is stable in mechanical reliability can be obtained.

The reason why the module becomes stable in mechanical reliability is as follows:

The temperature of the solar cell module employing a glass substrate rises during use. If a temperature distribution occurs in the glass substrate, the glass substrate may be cracked. The temperature distribution is marked particularly at an early time on a winter day. If a crack is present at an edge portion of the glass substrate, the glass substrate may easily break down. When parts of an electrode layer and a semiconductor layer are mechanically removed, the glass used as a substrate may be cracked. In particular, if the edge portion of the glass substrate has a right-angled portion or an acute-angled portion, that glass substrate is easily cracked. For this reason, it is preferable that the peripheral edge of the glass substrate be free from the right-angled portion or the acute-angled portion.

The peripheral edge of the light-transmitting glass substrate may be formed into a polygonal configuration, or into an arcuate configuration. The shaping of the peripheral edge in this manner can be realized by mechanically grinding the right angle portion (chamfering) if the original shape is of a right-angled edge, thereby forming it into a polygonal configuration. Alternatively, the peripheral edge of the glass substrate may be thermally fused thereby removing the right-angled edge portion.

It is also possible to perform the chamfering of the peripheral edge thereby to manufacture a glass substrate having the aforementioned configuration. Specifically, the chamfering can be performed by employing a disk-like grinding machine having an annular groove formed along the outer periphery thereof and shaped to conform with a cross-sectional configuration desired to obtain, and by contacting the edge of the glass substrate with the annular groove moving through the rotation of the disk-like grinding machine. However, any other chamfering methods can be employed.

In the thin film solar cell module according to the first embodiment of this invention, the peripheral portion of the active region consisting of a plurality of cells which are isolated from each other and electrically connected with each other is removed by mechanical means or by means of laser beam. As a result, it is possible to ensure an excellent insulation throughout the entire periphery of the module. Further, since the substrate or the first electrode layer is exposed all along the entire periphery of the module, it is possible to ensure an excellent adhesion thereof with a resin, thus making it possible to substantially prevent water from penetrating through a peripheral portion of the substrate. Therefore, it is possible according to this first embodiment to obtain a module excellent in dielectric strength with a high yield.

In the solar cell module according to the first embodiment of the present invention, the first electrode layer may be made of a metal electrode, and the second electrode layer may be made of a transparent electrode.

The thin film solar cell module according to a second embodiment of this invention is featured in that a periphery of the solar cell region (the active portion or the power-generating region) is surrounded by a high adhesive strength region which is larger in adhesive strength to the encapsulant, thereby allowing the substrate and the encapsulant to be strongly adhered to each other at the peripheral region of the substrate, thus improving the water tightness of the peripheral portion of the solar cell module.

According to the solar cell module of the first embodiment of this invention, the improvement of dielectric strength and of adhesion is effected exclusively by the removal of the peripheral portion of the active region, whereas, the solar cell module of the second embodiment of this invention is directed to the formation of a region which is larger in adhesive strength against the encapsulant at the periphery of the active region, though there are many aspects which overlap with the features of the solar cell module of the first embodiment.

As for the material of the encapsulant, ethylene-vinyl acetate copolymer (EVA), polyisobutylene, polyvinylbutyral, silicone, etc. can be employed. As for the protective film, a vinyl fluoride film, a laminate consisting of a vinyl fluoride film and an aluminum foil can be employed. It is also possible to employ, as the protective film, a metal plate, a glass woven fabric, a glass nonwaven fabric etc.

The adhesive strength between an underlying material and the encapsulant can be evaluated by measuring the vertical peel strength (JIS K6854) for instance. Specifically, the vertical peel strength of EVA which had been adhered as an encapsulant to an underlying material was measured, using, as an underlying material, a glass substrate, a transparent conductive oxide such as $SnO_2$ constituting the first electrode layer, a semiconductor, and a metal constituting the second electrode layer. As a result, the vertical peel strength of EVA was 15 kgf/cm or more (or the highest value in this measurement) when the glass substrate was employed as an underlying material, and 14 kgf/cm when the transparent conductive oxide was employed as an underlying material, which is much higher than 0.5 to 4 kgf/cm which were obtained when the semiconductor or metal was employed as an underlying material. The peel strength varies prominently depending on the kind of metal and on the surface condition. For example, in the case of a refractory metal such as Cr, Mo, W and Ti, the variation of peel strength is relatively small. However, in the case of ordinary electrode materials such as Ag and Al, the peel strength thereof was generally less than 3 kgf/cm.

Therefore, when the periphery of the solar cell region is surrounded by a region which is larger in adhesive strength to the encapsulant than that between the encapsulant and the electrically connected solar cells, e.g. by a region whose vertical peel strength to the encapsulant is 3 kgf/cm or more, more preferably 10 kgf/cm or more, it becomes possible to improve the water tightness and weather resistance of the peripheral portion of the solar cell module.

According to this second embodiment of this invention, the region having such a high adhesive strength can be realized by (1) the exposed portion of the first electrode layer consisting of a transparent conductive oxide, (2) the exposed portion of the substrate, or (3) a layer of a metal selected from the group consisting of Cr, Mo, W and Ti.

If the region having such a high adhesive strength is to be constituted by the exposed portion of the first electrode layer consisting of a transparent conductive oxide, a method may be employed wherein the second electrode layer and the semiconductor layer that have been deposited or laminated at the peripheral portion of the substrate by means of a CVD method or a sputtering method for instance are removed by mechanical means or by means of laser beam. This removing method by mechanical means or by means of laser beam may be the same as explained with reference to the aforementioned first embodiment.

If the region having such a high adhesive strength is to be constituted by the exposed portion of the substrate, a method may be employed wherein the second electrode layer, the semiconductor layer and the first electrode layer formed at the peripheral surface portion of the substrate as well as the peripheral portion of the substrate per se are mechanically removed. In this case, a total removal thickness of the second electrode layer, the semiconductor layer, the first electrode layer and the substrate, which are removed by the mechanical means, should preferably be in the range of 5 $\mu$m to 100 $\mu$m, more preferably in the range of 10 $\mu$m to 25 $\mu$m.

The exposed surface of the first electrode layer or of the substrate obtained in this manner may be subjected to a surface treatment using a silane coupling agent.

If the region having such a high adhesive strength is to be constituted by a layer of a metal selected from the group consisting of Cr, Mo, W and Ti, a method may be employed wherein the region is subjected to a primer treatment using a treating solution containing any one of these metals. Alternatively, another method may be employed wherein the active portion of the solar cell is masked, and then a metal selected from the group consisting of Cr, Mo, W and Ti is vapor-deposited or sputtered. In any of these methods, there is not any particular limitation regarding the underlying material, so that a metal selected from the group consisting of Cr, Mo, W and Ti may be deposited on the surface of the second electrode layer.

The width of the region having a high adhesive strength to the encapsulant at the peripheral portion of the substrate may be selected so as to ensure a sufficient adhesive strength, e.g. 0.5 mm or more, more preferably 0.5 mm to 10 mm, most preferably 1 mm to 5 mm.

Since the thin film solar cell module according to the second embodiment of this invention is featured in that a periphery of the solar cell region is entirely surrounded by a high adhesive strength region which is larger in adhesive strength to the encapsulant, it becomes possible to ensure an excellent adhesion to the encapsulant and to prevent the deterioration of power-generating property due to the penetration of water, thereby improving the weather resistance of the solar cell module.

Next, this invention will be further explained in details with reference to the following various examples.

EXAMPLE 1

FIG. 1 is a cross-sectional view of a thin film solar cell module according to Example 1. The solar cell module shown in FIG. 1 can be manufactured as follows.

First of all, a tin oxide film (8,000 angstroms) 2 was deposited by means of a thermal CVD method on a glass substrate 1 made of a soda lime glass having an area of 92 cm×46 cm and a thickness of 4 mm. Thereafter, the tin oxide film was subjected to a patterning process using a laser scriber thereby forming a transparent electrode. The reference numeral 3 denotes the scribed line of the transparent electrode.

As a patterning method, the substrate 1 was set on an X-Y table, and then subjected to a partitioning work using a Q switch YAG laser. The operation conditions of the laser were: 532 nm in second harmonic wave, 3 kHz in oscillation frequency, 500 mW in average output, and 10 nsec in pulse width. The isolation width was 50 $\mu$m and the width of the string (individual solar cell) was about 10 mm.

In order to electrically isolate the active region of the solar cell from the peripheral portion thereof throughout the entire circumference of the active region, a patterning using a laser beam was performed, in addition to the worked portion 12 for the string isolation, at the location 5 mm distanced away from the periphery of the substrate. The reference numeral 13 denotes a laser insulation-isolating line formed as a result of this patterning.

Further, a region 14 having a width of 3.5 mm for forming an electrode-lead out wiring formed of a plated copper foil was formed on the outside of strings 11a and 11b. By means of a multiple chamber plasma CVD method, an a-Si layer 4 was formed on the tin oxide film 2 patterned in advance as mentioned above. Namely, a p-type a-Si:H layer, an i-type a-Si:H layer, and an n-type micro-crystalline Si:H layer were successively deposited at a temperature 200° C., thereby forming a laminated a-Si layer 4 constituting a PIN junction. In order to form each layer, $SiH_4$ gas was employed at a flow rate of 100 sccm, 500 sccm and 100 sccm, respectively. In the cases of forming the p-type semiconductor layer and the n-type semiconductor layer, 2000 sccm of $B_2H_6$ gas and 2000 sccm of $PH_3$ gas each diluted by 1000 ppm of hydrogen gas were added to $SiH_4$ gas, respectively.

Further, in the formation of the p-type semiconductor layer, 30 sccm of $CH_4$ gas was mixed into the reaction gas thereby performing the carbonization of the a-Si. The power employed for the formation of each layer was 200 W, 500 W and 3 kW, respectively, while the reaction pressure employed was 1 torr, 0.5 torr and 1 torr, respectively. The film thickness of each layer formed was assumed to be 150 angstroms, 3200 angstroms and 300 angstroms, respectively, in view of the time required for the formation of the films. After the formation of each film, the substrate 1 was set on an X-Y table and then the patterning of a-Si layer 4 was performed using a Q switch YAG laser while off-setting the position thereof from the patterning position of the $SnO_2$ 2 by a distance of 100 $\mu$m. The operation conditions of the laser were: 532 nm in second harmonic wave, 3 kHz in oscillation frequency, 500 mW in average output, and 10 nsec in pulse width. The isolation width was set to 100 $\mu$m by defocusing the laser beam to enlarge the beam diameter. The reference numeral 5 denotes a semiconductor-scribing line.

Subsequently, a ZnO layer (not shown) having a film thickness of 1000 angstroms was formed on the patterned a-Si layer 4 by means of a magnetron sputtering method using an RF discharge and a ZnO target. The conditions for the sputtering were: 2 mtorr in argon gas pressure, 200 W in discharge power, and 200° C. in film-forming temperature.

Then, a reverse electrode layer 6 having a film thickness of 2000 angstroms was formed on the ZnO layer at room temperature by making use of an Ag target of the same magnetron sputtering device and a DC discharge. The conditions for the sputtering were: 2 mtorr in argon gas pressure, and 200 W in discharge power.

Next, the substrate 1 was taken out of the magnetron sputtering device and set on the X-Y table, and then, the Ag layer and the ZnO layer were subjected to a patterning process using a Q switch YAG laser, thereby forming a reverse electrode-scribing line 7 which was off-set by a distance of 100 $\mu$m from the semiconductor-scribing line 5. The operation conditions of the laser were the same as those employed in the processing of the a-Si layer 4. The partitioning width was 70 $\mu$m and the width of the string was about 10 mm.

In the same manner as in the case of the tin oxide film 2, for the purpose of electrically isolating the active region of the solar cell from the peripheral portion thereof throughout the entire circumference of the active region, a patterning using a laser beam was performed, in addition to the isolation of string, at the location 5 mm distanced away from the periphery of the substrate. The isolating width was 150 $\mu$m and the patterning was performed so as to include the isolating portion 13 of the tin oxide film 2.

Then, the entire outer peripheral portion 15 located 0.5 mm outside this patterning line was subjected to a grinding treatment to abrade it to a depth of about 25 $\mu$m by making use of an X-Y stage and a grinding machine having a finely adjustable (in the Z-axis direction) flat rotary gear which was developed originally by the present inventors. Namely, the entire thickness of each of the reverse electrode layer 6, the ZnO layer, the a-Si layer and the tin oxide layer 2 was removed, and at the same time, the surface portion of the glass substrate 1 was also removed. The working speed was 3.5 $\mu$m/min.

Thereafter, a bus bar electrode 18 consisting of a solder layer 16 and a copper plating foil 17 was formed at the position 14 of the aforementioned wiring, thereby forming an electrode-lead out wiring. The electrode 18 was made parallel with the string.

The reverse surface of the module constructed in this manner was then covered by a protective film 8 consisting of a vinyl fluoride film (DuPont Corporation, Tedler (tradename)) and then, sealed by allowing an EVA sheet to be thermally fused using a vacuum laminator. Subsequently, terminals were attached to the module and the resultant module was attached to a frame.

The solar cell module obtained in this manner was measured with respect to the current/voltage properties thereof by making use of an AM 1.5 solar simulator of 100 mW/cm$^2$. As a result, the solar cell module was found to have a short-circuit current of 1240 mA, an open-circuit voltage of 44.2V, a fill factor of 0.68 and a maximum output of 37.3 W.

Then, both plus and minus poles of the lead-out terminal was allowed to cause a short-circuit and at the same time, a voltage of 1500V was applied between the terminal and the frame to measure the resistance. As a result, the resistance was found 100 M$\Omega$ or more, thus indicating an excellent insulation.

Finally, the module was immersed in water for 15 minutes, and then, the resistance thereof was measured in the same manner as explained above, finding also a resistance of 100 M$\Omega$ or more.

EXAMPLE 2

In the same manner as explained in Example 1, the processes up to the step of the laser scribing of the reverse electrode 6 and the a-Si layer 4 were repeated. Then, a mask consisting of an SUS plate was placed on the active portion of the solar cell, and the resultant solar cell was subjected to blasting of a grinding agent having an average particle diameter of about 40 $\mu$m by making use of a blast cleaner, thereby mechanically removing the reverse electrode 6, the a-Si layer 4, the transparent electrode 2 and the surface portion of the substrate 1, which are located at the peripheral portion of the substrate 1. Thereafter, a solar cell module as shown in FIG. 1 was manufactured in the same manner as explained in Example 1, and then, measured of its properties in the same manner as explained in Example 1. As a result, the properties of the solar cell module was found almost the same as those of Example 1. Namely, the solar cell module was found to have a short-circuit current of 1240 mA, an open-circuit voltage of 44.2V, a fill factor of 0.68 and a maximum output of 37.3 W.

Further, the resistance between the lead-out terminal and the frame was found 100 M$\Omega$ or more in both before and after the immersion thereof in water.

Comparative Example

Figure 2:
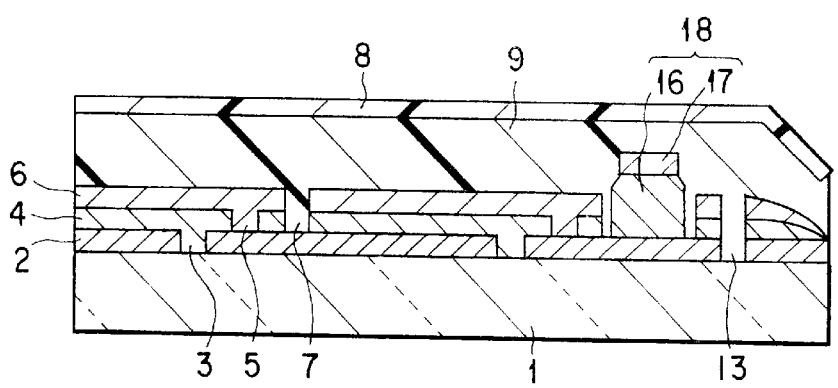
FIG. 2 is a cross-sectional view of a thin film solar cell module according to Comparative Example.
Figure 4:
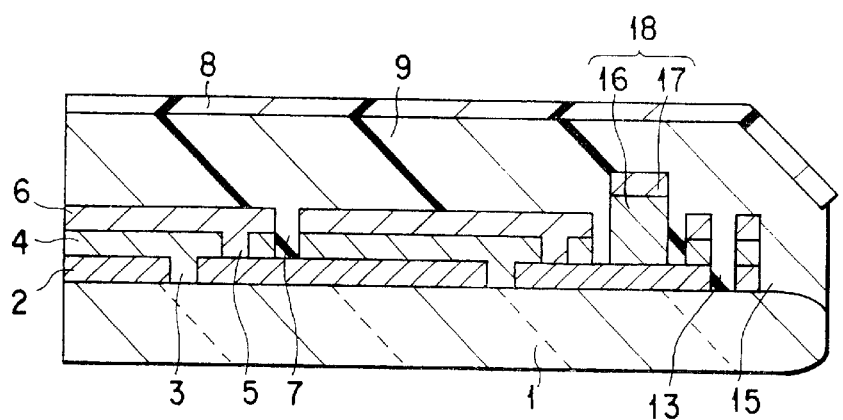
FIG. 4 is a cross-sectional view of a thin film solar cell module using glass substrate with chamfered edge.

A solar cell module was manufactured in the same manner as explained in Example 1 except that the mechanical removal of the peripheral portion of the substrate 1 was not performed, as shown in FIG. 2. Then, the solar cell module was measured of its properties in the same manner as explained in Example 1. As a result, the properties of the solar cell module was found to have a short-circuit current of 1240 mA, an open-circuit voltage of 43.1V, a fill factor of 0.68 and a maximum output of 36.3 W, thus indicating almost the same degree of properties as those of Example 1. However, the resistance between the lead-out terminal and the frame was found 800 k$\Omega$ before the immersion thereof in water and 15 k$\Omega$ after the immersion thereof in water, thus indicating much lower values as compared with the results of Examples 1 and 2. This can be attributed to the fact that the peripheral portion of the substrate 1 was poor in adhesive strength of the encapsulant so that water was enabled to enter into the module through an interface between the encapsulant and the peripheral portion of the substrate.

EXAMPLE 3

Figure 5:
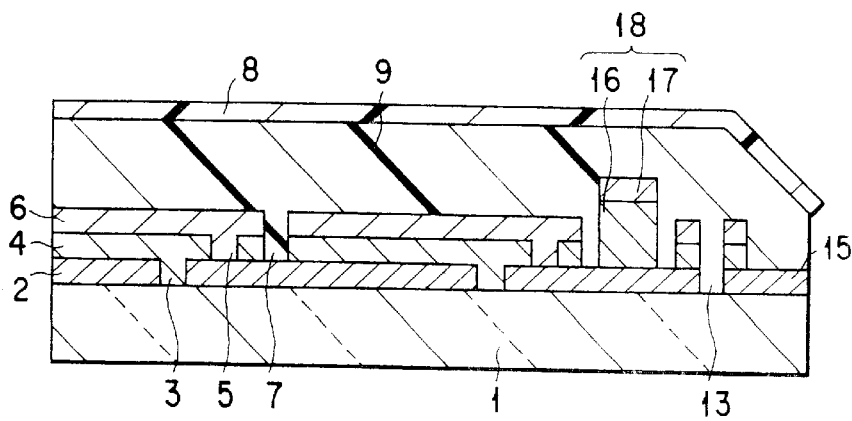
FIG. 5 is a cross-sectional view of a thin film solar cell module according to Example 3.
Figure 3:
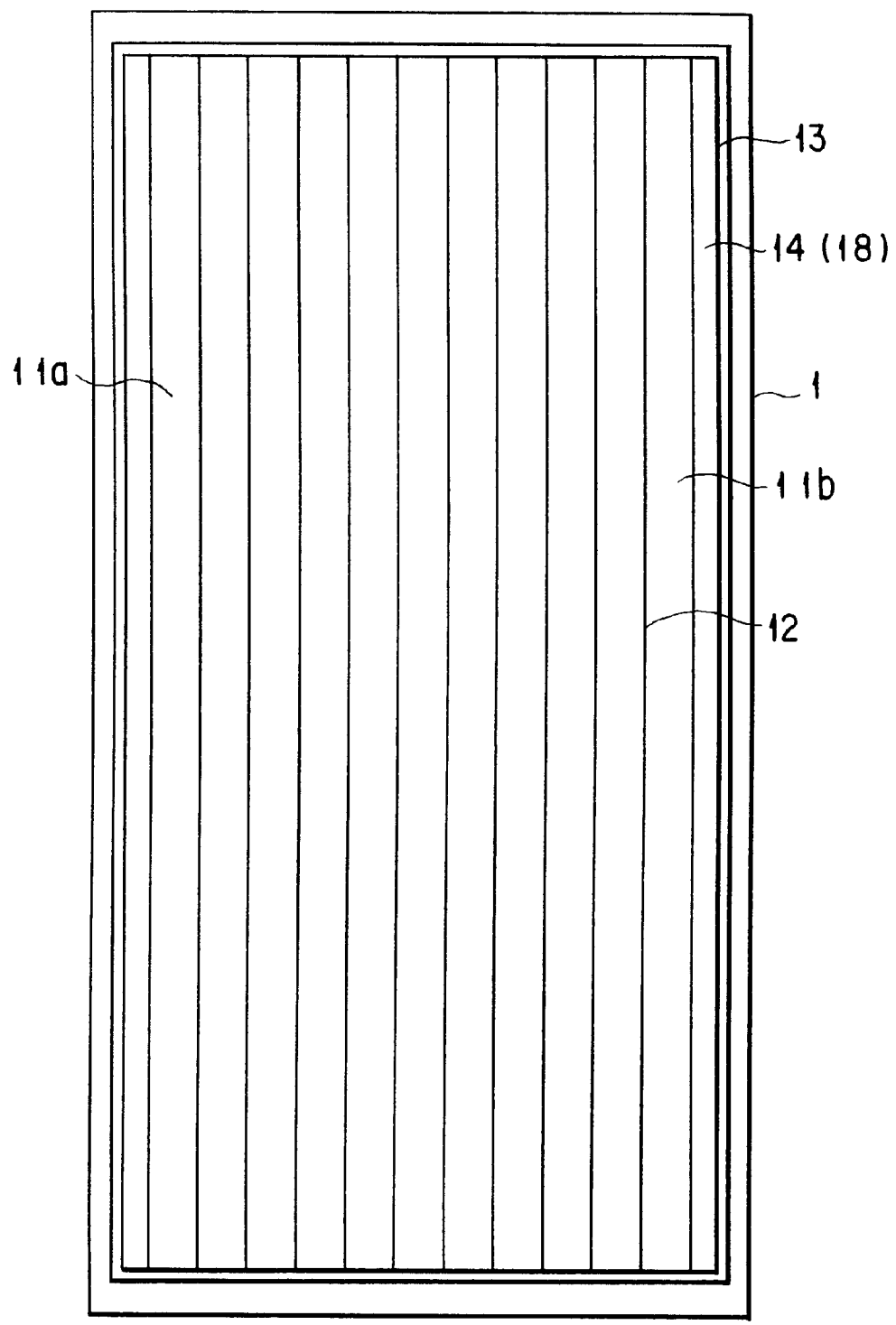
FIG. 3 is a plan view of the thin film solar cell module shown in FIGS. 1 and 2.

A solar cell module was manufactured in the same manner as explained in Example 1 except that part of each of the reverse electrode 6, the ZnO layer and the a-Si layer 4, which was located at the peripheral portion of the substrate 1 was removed by means of grinding but the tin oxide film 2 was not removed, as shown in FIG. 5. As a result, almost the same results as those of Example 1 could be obtained. Namely, the solar cell module obtained in this manner was measured with respect to the current/voltage properties thereof by making use of an AM 1.5 solar simulator of 100 mW/cm$^2$. As a result, the solar cell module was found to have a short-circuit current of 1240 mA, an open-circuit voltage of 44.2V, a fill factor of 0.68 and a maximum output of 37.3 W.

Then, both plus and minus poles of the lead-out terminal was allowed to cause a short-circuit and at the same time, a voltage of 1500V was applied between the terminal and the frame to measure the resistance. As a result, the resistance was found 100 M$\Omega$ or more, thus indicating an excellent insulation. Furthermore, the module was immersed in water for 15 minutes, and then, the resistance thereof was measured in the same manner as explained above, finding also a resistance of 100 M$\Omega$ or more, indicating an excellent insulating property thereof.

EXAMPLE 4

A solar cell module was manufactured in the same manner as explained in Example 1 except that part of each of the reverse electrode 6, the ZnO layer and the a-Si layer 4, which was located at the peripheral portion of the substrate 1 was removed by irradiating a laser beam. As a result, almost the same results as those of Example 1 could be obtained.

The operation conditions of the laser were: 532 nm in second harmonic wave, 10 kHz in oscillation frequency, 1.5 W in average output, and 50 nsec in pulse width. The width was set to 300 $\mu$m by defocusing the laser beam to enlarge the beam diameter. The relative moving speed of the laser beam and the sample was 200 mm/sec.

EXAMPLE 5

A solar cell module was manufactured in the same manner as explained in Example 1 except that a Ti layer was formed on an Al layer as the second electrode by sputtering such that the Ti layer was exposed at the uppermost surface. In particular, the Ti layer was surely formed at the peripheral portion of the substrate 1. The thickness of the Ti layer was 30 nm. As a result, almost the same results as those of Example 1 could be obtained.

As explained above, it is possible according to the present invention to provide a solar cell module excellent in dielectric strength, which can be manufactured by making use of very simple process. Further, it is possible to obtain a solar cell module which is free from deterioration of power-generating property due to a corrosion after sealing thereof and which can be manufactured with high productivity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thin film solar cell module which comprises a first electrode layer, a semiconductor layer and a second electrode layer, which are deposited on a substrate and at least part of which is worked to partition these layers into a plurality of cells which are electrically connected with each other and sealed with an encapsulant;
   wherein at least part of at least one of said first electrode layer, said semiconductor layer and said second electrode layer, which is located at the periphery of said substrate, is removed by mechanical means or by means of laser beam; and
   wherein that portions of said first electrode layer, said semiconductor layer and said second electrode layer, which are located inside and apart from the removed portion, are removed to form and isolating groove.

2. The thin film solar cell module according to claim 1, wherein said removal by mechanical means is effected by a surface abrasion method.

3. The thin film solar cell module according to claim 1, said removal by mechanical means is effected by a mechanical etching method employing a blasting of fine particles 100 $\mu$m or less in particle diameter.

4. The thin film solar cell module according to claim 1, said removal by means of laser beam is effected by laser beam which is enlarged in beam diameter.

5. The thin film solar cell module according to claim 1, wherein said removal by mechanical means is performed against that portions of the second electrode layer and the semiconductor layer, which is located at the periphery of the substrate, thereby allowing that surface of the first electrode layer to be exposed.

6. The thin film solar cell module according to claim 1, wherein said removal by mechanical means is performed against that portions of the first electrode layer, the semiconductor layer and the second electrode layer, which is located at the periphery of the substrate, thereby allowing the surface of the substrate to be exposed.

7. The thin film solar cell module according to claim 1, wherein said removal by mechanical means is performed against part of the substrate also, a total removal thickness of the substrate, the first electrode layer, the semiconductor layer and the second electrode layer, which are removed by the mechanical means, is in the range of 5 $\mu$m to 100 $\mu$m.

8. The thin film solar cell module according to claim 7, wherein said total removal thickness of the substrate, the first electrode layer, the semiconductor layer and the second electrode layer, which are removed by the mechanical means, is in the range of 10 $\mu$m to 25 $\mu$m.

9. The thin film solar cell module according to claim 1, wherein said semiconductor layer is formed of a material mainly consisting of silicon.

10. The thin film solar cell module according to claim 1, wherein a width of the removed portion is in the range of 0.5 to 10 mm.

11. A thin film solar cell module which comprises a first electrode layer, a semiconductor layer and a second electrode layer, which are deposited on a substrate and at least part of which is worked to partition these layers into a plurality of cells which are electrically connected with each other and sealed with an encapsulant;
    wherein at least part of at least one of said first electrode layer, said semiconductor layer and said second electrode layer, which is located at the periphery of said substrate, is removed by mechanical means or by means of laser beam; and
    either the encapsulant or the substrate at the periphery of the solar cell module is free from having an acute-angled portion.

* * * * *